United States Patent [19]

Wahl et al.

[11] Patent Number: 4,704,586

[45] Date of Patent: Nov. 3, 1987

[54] BIPOLAR BANDWIDTH SWITCH FOR USE IN A PHASE-LOCKED LOOP

[76] Inventors: Jerry R. Wahl, 610 E. 77th St., Richfield, Minn. 55423; Richard E. Hester, 9360 Garrison Way, Eden Prairie, Minn. 55344

[21] Appl. No.: 22,382

[22] Filed: Mar. 6, 1987

[51] Int. Cl.$^4$ .............................................. H03L 7/10
[52] U.S. Cl. .......................................... 331/25; 331/8; 331/34
[58] Field of Search ....................... 331/1 A, 8, 10, 25, 331/34, 108 R; 455/260

[56] References Cited

U.S. PATENT DOCUMENTS 4,510,461 4/1985 Dickes et al. ...................... 331/8 X
4,516,083 5/1985 Turney ............................. 331/25 X Primary Examiner—Eugene R. LaRoche
Assistant Examiner—Robert J. Pascal

[57] ABSTRACT

An integrated circuit phase-locked loop includes a bipolar bandwidth switch for selectively coupling circuit elements of an external bandwidth filter network so as to control loop bandwidth. The bandwidth switch includes first and second switched terminal means which are coupled to the bandwidth filter network. A differential amplifier has a first control terminal coupled to the first switched terminal and a second control terminal coupled to the second switched terminal. The differential amplifier controls first and second currents as a function of a difference between potentials applied to the first and second switched terminals. A first current mirror couples the differential amplifier to the second switched terminal and controls current flow between a first supply terminal and the second switched terminal as a function of the first current. A second current mirror couples the differential amplifier to the second switched terminal and controls current flow between the second switched terminal and a second supply terminal as a function of the second current. Control means responsive to digital control signals control current flow through the differential amplifier, and thereby the impedance between the first and second switched terminals.

24 Claims, 2 Drawing Figures

BIPOLAR BANDWIDTH SWITCH FOR USE IN A PHASE-LOCKED LOOP

BACKGROUND OF THE INVENTION

1. Field of the Invention.

The present invention relates generally to switching circuits for switching terminals between high and low impedance states. In particular, the present invention is a bipolar AC switch for controlling frequency characteristics of a loop filter in a phase-locked loop.

2. Description of the Prior Art.

Phase-locked loops or PLL's are commonly used circuit elements. A typical phase-locked loop includes a phase detector which compares the frequency of an output signal generated by a voltage controlled oscillator with that of an input signal. The output of the phase detector is passed through a loop filter and fed to the voltage controlled oscillator. The voltage controlled oscillator thereby produces an output signal with a relative phase identical to that of the input signal. Frequency characteristics of the phase-locked loop are determined by the loop filter.

It is often desirable to selectively control the frequency characteristics of the loop filter. For example, to produce a phase-locked loop capable of quickly locking to the phase of input signals it is desirable to have a loop filter with high gain. However, when the loop filter has high gain, the output signal of the PLL is very sensitive to phase changes in the input signal and relatively unstable. Conversely, although a phase-locked loop with a low bandwidth filter will have a more stable output, its lock acquisition time is greater.

Phase-locked loops having switchable frequency characteristics are well known in the art. High bandwidth for fast acquisition is desired when starting the loop, while low bandwidth and stability are preferred during normal operation. Typically, the phase comparator and voltage controlled oscillator are fabricated on an integrated circuit, while the loop filter is formed by various resistors and capacitors external to the integrated circuit. A FET or other switching device, also external to the integrated circuit chip, is controlled by logic signals and switches a circuit element such as a resistor into or out of an RC network to change the bandwidth of the loop filter. In arrangements of this type, the FET is often connected between the switched circuit element and ground. When switched OFF it must provide a high impedance, while functioning as both an AC and DC ground when switched ON. As such, it is important that its offset voltage to ground be low so that the filter characteristics can be predicted.

The use of external circuit elements such as the switching FET described above is always undesirable since they require additional space and add additional expense beyond that of the integrated circuit. Although phase-locked loops which are fabricated on integrated circuits using CMOS or other technologies which will support a FET can have the FET fabricated thereon, this option is not available for PLLs fabricated using bipolar technology. Since bipolar transistors will only support DC current, more complicated switching arrangements must be utilized.

It is evident that there is a continuing need for digitally-controlled AC switching networks, especially those suitable for fabrication with bipolar technology. The AC switch should have a fast response time, and provide high output impedance in its OFF state with low leakage current. Of course, it must also be fabricated using as few devices as possible so as to be relatively inexpensive and require little area of the integrated circuit.

SUMMARY OF THE INVENTION

The present invention is a circuit for controlling impedance between first and second switched terminal means. First and second supply potentials are received by first and second supply terminal means, respectively. Differential means having a first control terminal coupled to the first switched terminal means and a second control terminal coupled to the second switched terminal means control first and second currents as a function of a difference between potentials applied to the first and second switched terminal means. First current mirror means coupled between the differential means and the second switched terminal means control current flow between the first supply terminal means and the second switched terminal means as a function of the first current. Second current mirror means coupled between the differential means and the second switched terminal means control current flow between the second switched terminal means and the second supply terminal means as a function of the second current. Control means control current flow through the differential means. The second switched terminal means is driven to a low impedance state with respect to the first switched terminal means when the control means causes current flow through the differential means. When the control means prevents current flow through the differential means, the second switched terminal means is driven to a high impedance state with respect to the first switched terminal means.

In one embodiment, the control means includes input terminal means for receiving digital control signals, current source means, and switching means. The current source means is coupled between the differential means and the second supply terminal means, and controls flow of the first and second currents through the differential means. The switching means is coupled between the input terminal means and the current source means and controls the current source means. The switching means switches the current source means ON thereby causing the circuit to be driven to its low impedance state when a first digital signal is received at the input terminal means. The switching means switches the current source means OFF and causes the circuit to be driven to its high impedance state when a second digital signal is received at the input terminal means.

In still other embodiments, the circuit is utilized as a bandwidth switch and is fabricated on an integrated circuit along with a phase comparator and a voltage controlled oscillator to form a phase-locked loop. The circuit elements of an external bandwidth filter network are selectively coupled by the bandwidth switch to control loop bandwidth. The bandwidth switch has a quick response time, and provides high impedance with low leakage current in its OFF state. The bandwidth switch requires relatively few transistors, and can therefore be inexpensively fabricated on an integrated circuit without requiring large amounts of area on the integrated circuit.

DETAILED DESCRIPTION OF THE PREFERRED EMBODIMENTS

Figure 1:
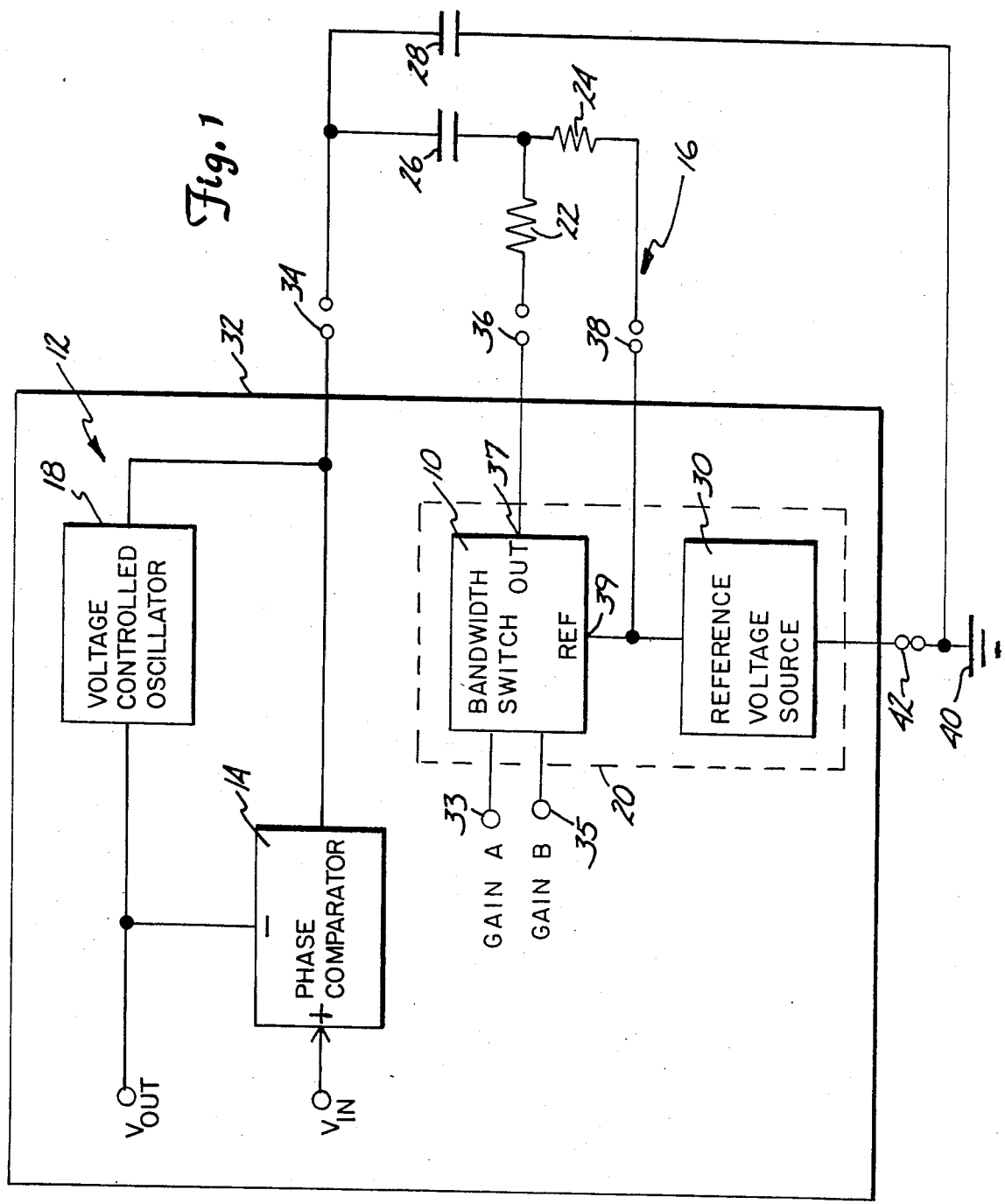
FIG. 1 is a block diagram representation of a phase-locked loop which includes a loop filter with a digitally controlled bandwidth switch in accordance with the present invention.

A phase-locked loop or PLL 12 which includes a loop bandwidth switch 10 in accordance with the present invention as illustrated generally in FIG. 1. PLL 12 includes phase comparator 14, loop filter 16, and voltage controlled oscillator (VCO) 18. Loop filter 16 includes loop bandwidth control 20 and several filter circuit elements including resistors 22 and 24 and capacitors 26 and 28. Loop gain control 20, in turn, is formed by loop bandwidth switch 10 and reference voltage source 30. With the exception of resistors 22 and 24 and capacitors 26 and 28 which are preferably external components, circuit elements of PLL 12 including phase comparator 14, bandwidth switch 10, voltage controlled oscillator 18, and reference voltage source 30 are fabricated on integrated circuit 32. Phase comparator 14, bandwidth 10, voltage controlled oscillator 18, and reference voltage source 30 are fabricated using bipolar technology in one preferred embodiment.

An input signal $V_{IN}$ which will typically be received from other circuit elements (not shown) on integrated circuit 32 is applied to a non-inverting (+) terminal of phase comparator 14, while an output signal $V_{OUT}$ produced by voltage controlled oscillator 18 is coupled to an inverting (−) terminal of the phase comparator. The output signal $V_{OUT}$ will also typically be used by other circuit elements (not shown) on integrated circuit 32. A signal produced by phase comparator 14 having a voltage which is determined as a function of a phase difference between the $V_{IN}$ and $V_{OUT}$ signals is coupled to voltage controlled oscillator 18, and to external capacitors 26 and 28 through terminal 34. Bandwidth switch 10 has an output (OUT) terminal 37 (a second switched terminal) which is coupled to external resistor 22 through terminal 36, and a reference (REF) terminal 39 (a first switched terminal) which is coupled to external resistor 24 through terminal 38. Reference voltage source 30 is coupled to ground 40 through terminal 42, and generates a reference voltage which is coupled to REF terminal 39 of bandwidth switch 10. Bandwidth switch 10 also includes GAINA terminal or terminal 33 and GAINB terminal or terminal 35 through which digital switching control signals are received from other circuit elements (not shown) on integrated circuit 32.

PLL 12 functions in a conventional manner in the sense that the phase of output signal $V_{OUT}$ is synchronized or "locked" with the phase of input signal $V_{IN}$. The frequency characteristics or dynamic response of PLL 12 is determined by the filter characteristics of loop filter 16. The filter characteristics of loop filter 16 are controlled by bandwidth switch 10, which selectively switches resistor 22 into and out of parallel connection with resistor 24 in response to control signals applied to GAINA terminal 33 and GAINB terminal 35.

Bandwidth switch 10 functions as a digitally controlled switch which controls the impedance between its REF terminal 39 and OUT terminal 37. When logic 1,0 signals are applied to GAINA terminal 33 and GAINB terminal 35, respectively, bandwidth switch 10 is switched to its OFF or high impedance state, and provides a high impedance path between OUT terminal 37 and REF terminal 39. Resistor 22 is thereby electrically disconnected from a parallel arrangement with resistor 24, causing loop filter 16 to have a first or relatively low bandwidth. The phase of output signal $V_{OUT}$ will then be relatively stable.

When logic 0,1 signals are applied to GAINA and GAINB terminals 33 and 35, respectively, bandwidth switch 10 is switched to its ON or low impedance state and provides a low impedance AC path between its OUT terminal 37 and REF terminal 39. Resistor 22 is thereby effectively connected in parallel with resistor 24, causing loop filter 16 to have a second or relatively high bandwidth. The phase of output signal $V_{OUT}$ can thereby be quickly locked to that of input signal $V_{IN}$.

Figure 2:
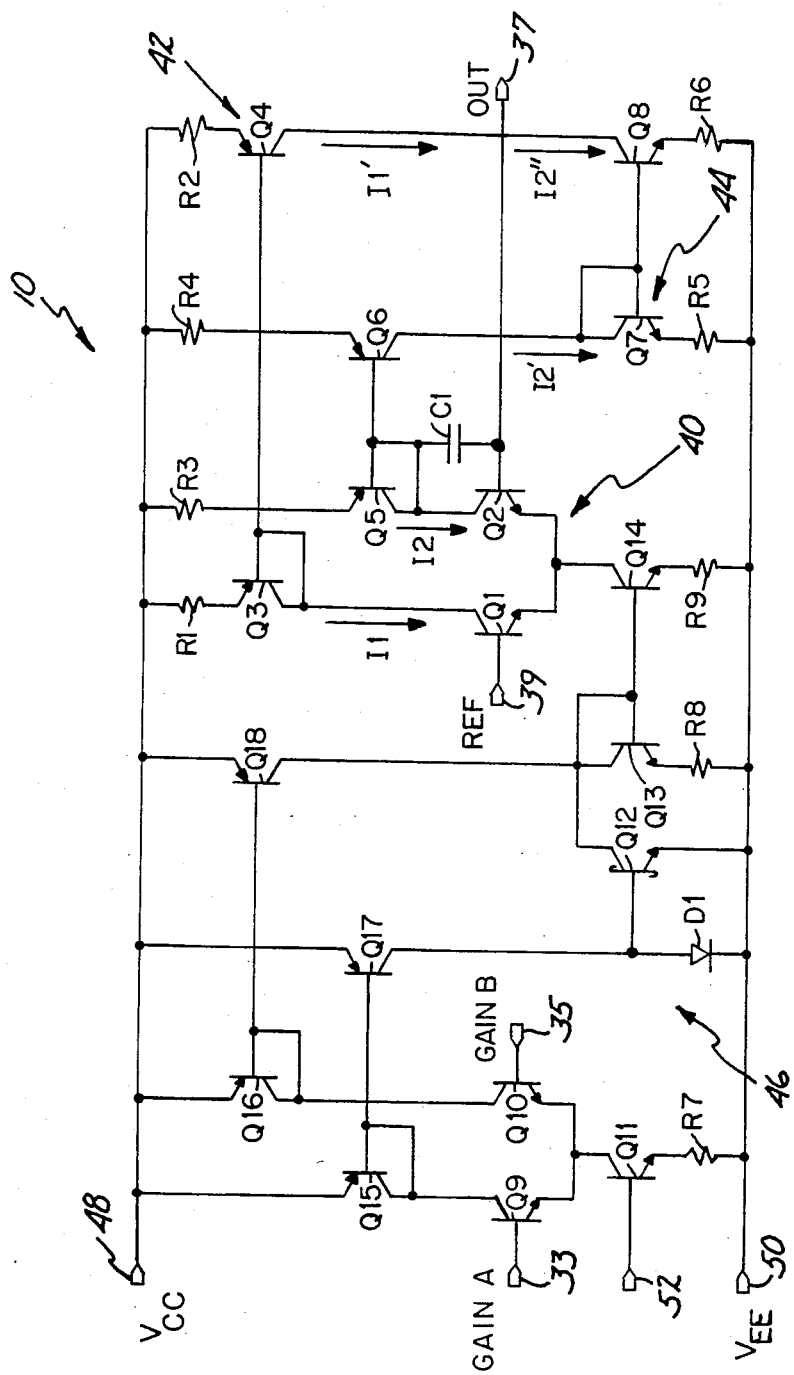
FIG. 2 is a detailed schematic diagram of the bandwidth switch shown in FIG. 1.

A detailed circuit implementation of bandwidth switch 10 is illustrated in FIG. 2. As shown, bandwidth switch 10 includes differential amplifier 40, first current mirror 42, second current mirror 44, and switching control circuitry 46, all of which are coupled between first supply terminal 48 and second supply terminal 50. First supply terminal 48 is connected to receive a first or relatively positive supply potential $V_{CC}$ while second supply terminal 50 is connected to receive a second or relatively negative supply potential $V_{EE}$. REF terminal 39 will be connected to receive a reference potential intermediate the first and second supply potentials from reference voltage source 30.

Differential amplifier 40 is formed by NPN bipolar transistors Q1 and Q2. Transistor Q1 has its base or control terminal coupled to REF terminal 39. The base or control terminal of transistor Q2 is coupled to OUT terminal 37. Emitters of transistors Q1 and Q2 are coupled together.

First current mirror 42 is formed by PNP bipolar transistors Q3 and Q4, and resistors R1 and R2. The emitter of transistor Q3 is coupled to first supply terminal 48 through resistor R1. The collector of transistor Q3 is coupled to its base, and to the collector of transistor Q1. The emitter of transistor Q4 is coupled to first supply terminal 48 through resistor R2, while its base is connected to the base of transistor Q3. The collector of transistor Q4 is coupled to OUT terminal 37.

Second current mirror 44 is formed by PNP bipolar transistors Q5 and Q6, NPN bipolar transistors Q7 and Q8, resistors R3–R6, and capacitor C1. The emitter of transistor Q5 is coupled to first supply terminal 48 through resistor R3. The collector of transistor Q5 is coupled to the collector of transistor Q2, to a first terminal of capacitor C1, and to the bases of transistors Q5 and Q6. A second terminal of transistor C1 is coupled to the base of transistor Q2. The emitter of transistor Q6 is coupled to first supply terminal 48 through resistor R4. The collector of transistor Q6 is coupled to both the collector and base of transistor Q7, and to the base of transistor Q8. The emitters of transistors Q7 and Q8 are coupled to second supply terminal 50 through resistors R5 and R6, respectively. A collector of transistor Q8 is coupled to OUT terminal 37.

Switching control circuitry 46 is formed by NPN bipolar transistors Q9–Q14, PNP bipolar transistors Q15–Q18 resistors, R7–R9, and diode D1. The base of transistor Q9 is coupled to GAINA terminal 33, while the base of transistor Q10 is coupled to GAINB terminal 35. Emitters of transistors Q9 and Q10 are connected together and coupled to the collector of transistor Q11. The emitter of transistor Q11 is connected to second supply terminal 50 through resistor R7. The base of transistor of Q11 is connected to an auxilary current source (not shown) through terminal terminal 52.

Transistor Q15 has its collector connected to its base, to the collector of transistor Q9, and to the base of transistor Q17. The emitter of transistor Q15 is connected to first supply terminal 48. The collector of transistor Q16 is connected to its base, to the collector of transistor Q10, and to the base of transistor Q18. The emitter of transistor Q16 is connected to first supply terminal 48. The emitter of transistor Q17 is connected to first supply terminal 48, while its collector is connected to second supply terminal 50 through diode D1. Transistor Q18 has its emitter connected to first supply terminal 48. The collector of transistor Q18 is connected to the collectors of transistors Q12 and Q13, and to the bases of transistors of Q13 and Q14.

Transistor Q12 has its base connected to the collector of transistor Q17, and its emitter connected to second supply terminal 50. The emitter of transistor Q13 is connected to second supply terminal 50 through resister R8. The collector of transistor Q14 is connected to the emitters of transistors Q1 and Q2. Transistor Q14 has its emitter coupled to second supply terminal 50 through resistor R9.

Bandwidth switch 10 operates as follows. Transistor Q11 and resistor R7 function as a current source. When logic 1,0 signals are applied to GAINA terminal 33 and GAINB terminal 35, respectively, transistor Q9 is driven ON, while transistor Q10 is switched OFF. Current therefore flows through transistors Q11, Q9 and Q15, and is mirrored through transistor Q17 and diode D1. The resulting voltage drop across diode D1 will switch transistor Q12 ON, causing base current to transistor Q14 to be shunted through transistor Q12 to second supply terminal 50. Since it is provided no base current, transistor Q14 is switched OFF. Transistor Q14 and resistor R9 together form a current source. However, with transistor Q14 switched OFF, there will be no current flow through either transistor Q1 or Q2 of differential amplifier 40. As a result, OUT terminal 37 is electrically isolated from and at a high impedance with respect to REF terminal 39.

When logic 0,1 signals are applied to GAINA terminal 33 and GAINB terminal 35, respectively, transistor Q9 is switched OFF while transistor Q10 is switched ON. Current will therefore flow between first supply terminal 48 and second supply terminal 50 through transistors Q16, Q10, and Q11. This current is mirrored through transistors Q18 and Q13, and provides sufficient base drive current to switch transistor Q14 ON. With transistor Q14 switched ON, OUT terminal 37 is forced to be at the same potential as REF terminal 39 due to the negative feedback provided by differential amplifier 40, first current mirror 42, and second current mirror 44. This negative feedback causes both the output impedance and the offset voltage between OUT terminal 37 and REF terminal 39 to be low.

A more detailed description of the operation of bandwidth switch 10 when driven to its low impedance state follows. When the voltage potential applied to OUT terminal 37 equals that applied to REF terminal 39, differential amplifier 40 is balanced and has currents I1 and I2 of equal magnitude flowing through transistors Q1 and Q2, respectively. Current I1 is mirrored through transistors Q3 and Q4, and produces current I1' of proportional magnitude through transistor Q4. Current I2 is mirrored through transistors Q5 and Q6 to produce current I2' of proportional magnitude through transistor Q6. Current I2', in turn, is mirrored through transistors Q7 and Q8 to produce current I2" of proportional magnitude through transistor Q8. Currents I1' and I2" are of equal magnitude when the potentials at OUT terminal 37 and REF terminal 39 are equal. As a result, current will be neither sourced to nor sunk from OUT terminal 37.

Should the potential applied to OUT terminal 37 drop below that applied to REF terminal 39, differential amplifier 40 will become unbalanced causing the magnitude of current I1 to be greater than that of current I2. Accordingly, mirrored current I1' will have a magnitude greater than that of mirrored current I2", with the difference between these two currents being sourced to OUT terminal 37. As a result, the potential at OUT terminal 37 will be forced to increase until it is equal to that applied to REF terminal 39.

Should the potential applied to OUT terminal 37 exceed that applied to REF terminal 39, differential amplifier 40 will become unbalanced in the opposite direction, with the magnitude of current I2 exceeding that of current I1. Mirrored current I2" will therefore be proportionally greater than that of mirrored current I1', with the difference being sunk from OUT terminal 37. This action will tend to lower the potential at OUT terminal 37 until it equals that at REF terminal 39. It is evident, therefore, that bandwidth switch 10 functions as a unity gain transconductance amplifier in that differences in voltage produce corresponding differences in currents.

Capacitor C1 is included within bandwidth switch 10 to add a dominant pole to the feedback network thereby ensuring unity gain stability. Transistor Q12 and diode D1 speed up the switching response of bandwidth switch 10 from its low impedance state to its high impedance state. When bandwidth switch 10 is switched to its high impedance state (i.e., logic 1,0 signals applied to GAINA terminal 33 and GAINB terminal 35, respectively) transistor Q12 is actively switched ON thereby shunting base current from transistor Q14. This shunting action occurs before transistor Q13 would otherwise be switched OFF, thereby more quickly driving bandwidth switch 10 to its high impedance state.

Although the present invention has been described with reference to the preferred embodiments, those skilled in the art will realize that changes may be made in form and detail without departing from the spirt and scope of the invention.

What is claimed is:

1. A circuit for controlling impedance between first and second switched terminals, including:
   first supply terminal means for receiving a first supply potential;
   second supply terminal means for receiving a second supply potential;
   first switched terminal means;
   second switched terminal means;
   differential means having a first control terminal coupled to the first switched terminal means and a second control terminal coupled to the second switched terminal means for controlling first and second currents as a function of a difference between potentials applied to the first and second switched terminal means;

first current mirror means coupled between the differential means and the second switched terminal means for controlling current flow between the first supply terminal means and the second switched terminal means as a function of the first current;

second current mirror means coupled between the differential means and the second switched terminal means for controlling current flow between the second switched terminal means and the second supply terminal means as a function of the second current; and control means for controlling current flow through the differential means, wherein the second switched terminal means is driven to a low impedance state with respect to the first switched terminal means when the control means causes current flow through the differential means, and the second switched terminal means is driven to a high impedance state with respect to the first switched terminal means when the control means prevents current flow through the differential means.

2. The circuit of claim 1 wherein the differential means includes:

a first transistor, for controlling the first current, having first and second terminals coupled between the first and second supply terminal means, and the first control terminal coupled to the first switched terminal means; and a second transistor, for controlling the second current, having first and second terminals coupled between the first and second supply terminal means, and the second control terminal coupled to the second switched terminal means.

3. The circuit of claim 2 wherein the first and second transistors have their second terminals interconnected.

4. The circuit of claim 2 wherein the first and second transistors comprise bipolar transistors.

5. The circuit of claim 3 wherein the first and second transistors of the differential means includes NPN bipolar transistors.

6. The circuit of claim 1 wherein the first current mirror means includes:

a first transistor, through which the first current flows, having first and second terminals coupled between the first supply terminal means and the differential means, and a control terminal; and a second transistor having first and second terminals coupled between the first supply terminal means and the second switched terminal means, and a control terminal coupled to the control terminal of the first transistor.

7. The circuit of claim 6 wherein the first and second transistors of the first current mirror means comprise bipolar transistors.

8. The circuit of claim 7 wherein the first and second transistors of the first current mirror means comprise PNP bipolar transistors.

9. The circuit of claim 1 wherein the second current mirror means comprises:

a first transistor, through which the second current flows, havin first and second terminals coupled between the first supply terminal means and the differential means and a control terminal coupled to the first terminal;

a second transistor having a first terminal, a second terminal coupled to the first supply terminal means, and a control terminal coupled to the control terminal of the first transistor;

a third transistor having a first terminal connected to the first terminal of the second transistor, a second terminal coupled to the second supply terminal means, and a control terminal coupled to the first terminal; and a fourth transistor having first and second terminals coupled between the second switched terminal means and the second supply terminal means, and a control terminal coupled to the control terminal of the third transistor.

10. The circuit of claim 9 wherein the first, second, third and fourth transistors of the second current means comprise bipolar transistors.

11. The circuit of claim 10 wherein the first and second transistors of the second current mirror means comprise PNP bipolar transistors, and the third and fourth transistors comprise NPN bipolar transistors.

12. The circuit of claim 1 wherein the control means includes:

input terminal means for receiving digital control signals;

current source means coupled between the differential means and the second supply terminal means for controlling flow of the first and second current through the differential means; and switching means coupled between the input terminal means and the current source means for controlling the current source means, the switching means switching the current source means ON and causing the circuit to be driven to its low impedance state when a first digital signal is received at the input terminal means, and switching the current source means OFF and causing the circuit to be driven to its high impedance state when a second digital signal is received at the input terminal means.

13. The circuit of claim 12 wherein the switching means includes:

second differential means having third and fourth control terminals coupled to the input terminal means for controlling third and fourth currents;

third current mirror means coupled between the differential means and the current source means for controlling the current source means as a function of the third current; and fourth current mirror means coupled between the differential means and the current source means for controlling the current source means as a function of the fourth current.

14. The circuit of claim 13 wherein the second differential means of the switching means includes:

a first transistor, for controlling the third current, having first and second terminals coupled between the first and second supply terminal means, and the third control terminal coupled to the input terminal means; and a second transistor, for controlling the fourth current, having first and second terminals coupled between teh first and second supply terminal means, and the fourth control terminal coupled to the input terminal means.

15. The circuit of claim 14 wherein the first and second transistors of the second differential means have their second terminals interconnected.

16. The circuit of claim 14 wherein the first and second transistors of the second differential means comprise bipolar transistors.

17. The circuit of claim 13 wherein the third current mirror means of the switching means includes:
   a first transistor, through which the third current flows, having first and second terminals coupled between the first supply terminal means and the differential means, and a control terminal coupled to the first terminal;
   a second transistor having first and second terminals coupled between the first and second supply terminal means, and a control terminal coupled to the control terminal of the first transistor; and
   a third transistor having first and second terminals coupled between the current source means and the second supply terminal means, and a control terminal coupled to the first terminal of the second transistor.

18. The circuit of claim 17 wherein the first, second and third transistors of the third current mirror means comprise bipolar transistors.

19. The circuit of claim 13 wherein the fourth current mirror means of the switching means includes:
   a first transistor, through which the fourth current flows, having first and second terminals coupled between the first supply terminal means and the second differential means, and a control terminal coupled to the first terminal;
   a second transistor having a first terminal, a second terminal coupled to the first supply terminal means, and a control terminal coupled to the control terminal of the first transistor; and
   a third transistor having a first terminal coupled to the first terminal of the second transistor, a second terminal coupled to the second supply terminal means, and a control terminal coupled to the first terminal and to the current source means.

20. The circuit of claim 19 wherein the first, second and third transistors of the fourth current mirror means comprise bipolar transistors.

21. A phase-locked loop, including:
   phase comparator means for comparing phases of input and output signals and for providing a phase difference signal as a function thereof;
   oscillator means responsive to the phase comparator means for providing an output signal as a function of the phase difference signal;
   a bandwidth filter network formed by a plurality of circuit elements; and
   bandwidth switch means responsive to digital control signals for selectively coupling elements of the bandwidth filter network between the phase comparator means and the oscillator means to control loop bandwidth, including:
      first supply terminal means for receiving a first supply potential;
      second supply terminal means for receiving a second supply potential;
      first switched terminal means coupled to the bandwidth filter network;
      second switched terminal means coupled to the bandwidth filter network;
      differential means having a first control terminal coupled to the first switched terminal means and a second control terminal coupled to the second switched terminal means, for controlling first and second currents as a function of a difference between potentials applied to the first and second switched terminal means;
      first current mirror means coupled between the differential means and the second switched terminal means for controlling current flow between the first supply terminal means and the second switched terminal means as a function of the first current;
      second current mirror means coupled between the differential means and the second switched terminal means for controlling current flow between the second switched terminal means and the second supply terminal means as a function of a second current; and
      control means responsive to the digital control signals for controlling current flow through the differential means, wherein the second switched terminal means is driven to a low impedance state with respect to the first switched terminal means thereby causing the loop to have a first bandwidth when the control means receives a first control signal and causes current flow through the differential means, and the second switched terminal means is driven to a high impedance state with respect to the first switched terminal means thereby causing the loop to have a second bandwidth when the control means receives a second control signal and prevents current flow through the differential means.

22. The phase-locked loop of claim 21 wherein the phase comparator means, oscillator means, and bandwidth switch means are fabricated on an integrated circuit.

23. The phase-locked loop of claim 22 wherein the phase comparator means, oscillator means, and bandwidth switch means are fabricated on the integrated circuit using a bipolar technology.

24. The phase-lock loop of claim 21 wherein the control means includes:
   input terminal means for receiving the digital control signals;
   current source means coupled between the differential means and the second supply terminal means for controlling flow of the first and second currents through the differential means; and
   switching means coupled between the input terminal means and the current source means for controlling the current source means, the switching means switching the current source means ON and causing the bandwidth switch means to be driven to its low impedance state when the first digital signal is received at the input terminal means, and switching the current source means OFF and causing the bandwidth switch means to be driven to its high impedance state when the second digital signal is received at the input terminal means.

* * * * *

UNITED STATES PATENT AND TRADEMARK OFFICE
CERTIFICATE OF CORRECTION

PATENT NO. : 4,704,586
DATED : November 3, 1987
INVENTOR(S) : Jerry R. Wahl et al.

It is certified that error appears in the above-identified patent and that said Letters Patent is hereby corrected as shown below:

Column 7, line 62, delete "havin" and insert --having--.
Column 8, line 61, delete "teh" and insert --the--.
On the first page of patent, please add as Assignee:
-- [73] Assignee: VTC Incorporated,
Bloomington, MN Signed and Sealed this Twentieth Day of September, 1988

Attest:

DONALD J. QUIGG

*Attesting Officer*   *Commissioner of Patents and Trademarks*